(12) United States Patent
Cerio, Jr.

(10) Patent No.: US 7,700,474 B2
(45) Date of Patent: Apr. 20, 2010

(54) BARRIER DEPOSITION USING IONIZED PHYSICAL VAPOR DEPOSITION (IPVD)

(75) Inventor: Frank M. Cerio, Jr., Schenectady, NY (US)

(73) Assignee: Tokyo Electron Limited, Tokyo (JP)

( * ) Notice: Subject to any disclaimer, the term of this patent is extended or adjusted under 35 U.S.C. 154(b) by 1022 days.

(21) Appl. No.: 11/279,039

(22) Filed: Apr. 7, 2006

(65) Prior Publication Data

US 2007/0238279 A1    Oct. 11, 2007

(51) Int. Cl.
    *H01L 21/44*    (2006.01)
(52) U.S. Cl. ............... 438/597; 438/584; 438/595; 438/758; 257/E21.169; 257/E21.585
(58) Field of Classification Search ......... 438/597, 438/584, 595, 758; 204/192.3; 257/758, 257/E21.169, E21.585
See application file for complete search history.

(56) References Cited

U.S. PATENT DOCUMENTS

| | | | |
|---|---|---|---|
| 6,051,114 A * | 4/2000 | Yao et al. ............ | 204/192.3 |
| 6,080,287 A | 6/2000 | Drewery et al. | |
| 6,132,564 A | 10/2000 | Licata | |
| 6,197,165 B1 | 3/2001 | Drewery et al. | |
| 6,287,435 B1 | 9/2001 | Drewery et al. | |
| 6,444,099 B1 * | 9/2002 | Sasaki et al. ........... | 204/192.12 |
| 2003/0034244 A1 * | 2/2003 | Yasar et al. .............. | 204/192.3 |
| 2003/0059538 A1 * | 3/2003 | Chung et al. .............. | 427/304 |
| 2004/0188239 A1 * | 9/2004 | Robison et al. .......... | 204/192.3 |
| 2005/0224979 A1 * | 10/2005 | Marathe et al. ............. | 257/758 |

* cited by examiner

*Primary Examiner*—Alexander G. Ghyka
*Assistant Examiner*—Abdulfattah Mustapha
(74) *Attorney, Agent, or Firm*—Wood, Herron & Evans, L.L.P.

(57) ABSTRACT

An iPVD system uses a high density inductively coupled plasma (ICP) at high pressure of at least 50 mTorr to deposit uniform ultra-thin layer of a tantalum nitride material barrier material onto the sidewalls of high aspect ratio nano-size features on semiconductor substrates, preferably less than 2 nm thick with less than 4 nm in the field areas. The process includes depositing an ultra-thin TaN barrier layer having a high nitrogen concentration that produces high resistivity, preferably at least 1000 micro-ohm-cm. The ultra-thin TaN film is deposited by a low deposition rate process of less than 20 nm/minute, preferably 2-10 nm/min, to produce the high N/Ta ratio layer without nitriding the tantalum target. The layer provides a barrier to copper (Cu) diffusion and a high etch resistant etch-stop layer for subsequent deposition-etch processes.

27 Claims, 9 Drawing Sheets

| WF. ID. | WF. ID. | THICKNESS [nm] | | CONCENTRATION [ATOMIC %] | | | | | | | | DENSITY (RBS) | | DENSITY (REAL) | | DENSITY |
|---|---|---|---|---|---|---|---|---|---|---|---|---|---|---|---|---|
| | | RBS | XRF | C | N | H | O | Si | Ar | Cl | Cu | Ta | [ATOMS/cm³] | [g/cm³] | [ATOMS/cm³] | [g/cm³] | % (TaN FCC) |
| 65mT | 8nm/min | 8 | 9.85 | | 45 | | | | | | | 55 | 9.80E+22 | | 7.96E+22 | 13.99 | 88 |
| 65mT | Edge | 7.5 | 10.2 | | 42 | | | | | | | 58 | 9.52E+22 | | 7.00E+22 | 12.89 | 81 |
| 90mT | 4nm/min | 8.5 | 9.02 | | 60 | | | | | | | 40 | 1.12E+23 | | 1.06E+23 | 14.16 | 89 |
| 90mT | 8nm/min | 8.5 | 9.04 | | 55 | | | | | | | 45 | 1.07E+23 | | 1.01E+23 | 14.90 | 93 |
| 90mT | 2nm/min | 7 | 9.18 | | 48.5 | | | | 3 | | | 48.5 | 1.00E+23 | | 7.63E+22 | 12.13 | 76 |

FIG. 4

BARRIER DEPOSITION USING IONIZED
PHYSICAL VAPOR DEPOSITION (IPVD)

This application is related to commonly assigned U.S. patent application Ser. No. 10/138,049, published as U.S. Patent Application Publication No. 20030034244, now U.S. Pat. No. 6,755,945, hereby expressly incorporated herein by reference.

FIELD OF THE INVENTION

The invention relates to the metallization of via and trench structures on semiconductor wafers. More particularly, the invention relates to the metallization of high aspect ratio via and trench structures of silicon wafers utilizing ionized sputtered materials to form barrier and seed layers on the substrates.

BACKGROUND OF THE INVENTION

In the metallization of high aspect ratio vias and trenches on semiconductor wafers, it is required that the barrier and seed layer have good sidewall coverage. Physical Vapor Deposition (PVD) processes have long been recognized as having certain advantages, namely their simplicity, their cleanliness, and other long known factors. However, most applications of PVD processes in semiconductor manufacture have encountered performance limitations, which have motivated the use of otherwise less desirable processes to overcome these limitations. For example, CVD processes are often resorted to for achieving high conformity and ALD processes are resorted to for achieving ultra-thin films.

Ionized PVD deposition have been preferred for barrier and seed layer metallization in advanced IC wafers in many applications. For example, IPVD has been used for applying tantalum nitride (TaN) barrier layers for copper (Cu). Ionized PVD provides good sidewall and bottom coverage in via and trench structures. However, as the geometries shrink and as the via dimensions go down below 0.15 micrometers, ionized deposition requirements become more critical. Therefore, it is highly desirable to have an ionized PVD process where bottom and sidewall coverage are well balanced and overhang is minimized.

Many prior art attempts to provide TaN barrier layers that effectively prevent oxidation of copper due to movement of oxygen from low-K dielectric substrates have resulted in the loss of conformality of the deposited film or nitridation of the tantalum target or other degradations in process performance.

Accordingly, there is a need to provide for the PVD of barrier layers of materials including TaN that overcome the problems of the prior art. Further, there remains a need to better control step coverage of the metal or the overhang that typically develops during the deposition step.

SUMMARY OF THE INVENTION

According to the principles of the present invention, an IPVD system and process are provided in which an ultra-thin TaN barrier layer is deposited on a substrate having a high nitrogen concentration using a low deposition rate process.

One embodiment of the invention provides a method of operating an Ionized Physical Vapor Deposition (IPVD) system to deposit a barrier layer. The method includes positioning a patterned substrate on a wafer table within a processing chamber depositing an ultra-thin tantalum (Ta) containing barrier layer having a high nitrogen concentration. A Low Net Deposition (LND) process is used to produce a high N/Ta ratio layer for providing a barrier to copper (Cu) diffusion and for providing a high etch resistant "etch stop" layer. Thereafter, the patterned substrate is removed from the processing chamber.

The LND process of certain embodiments of the invention can be a deposition-etch process in which a low net deposition is deposited on the field areas and sidewalls on the substrate, or deposition only process may be provided in which deposition is carried out at a very low deposition rate. The deposited film provides a barrier layer to copper diffusion and provides a high etch resistant etch-stop layer for subsequent processes.

According to certain principles of the invention, an IPVD method of depositing a barrier layer is carried out by establishing a pressure of at least 50 mTorr within a processing chamber and inductively coupling a plasma into the chamber from an RF antenna at a power and frequency that will create a high density inductively coupled plasma (ICP) in the processing chamber. Then an ultra-thin TaN barrier layer is deposited at a rate of not more than approximately 20 nanometers (nm) per minute by flowing a nitrogen containing gas into the chamber sufficient to produce a resistivity of at least 1000 micro-ohm-cm in the TaN layer.

According to certain embodiments of the invention, the depositing of the ultra-thin TaN barrier layer includes flowing the nitrogen containing gas at a rate, and operating the target at a power, that avoids nitriding the tantalum target. The depositing of the ultra-thin TaN barrier layer is preferably at a rate of between 2 nm and 10 nm per minute. Preferably also, the inductively coupling of plasma is sufficient to create a high density plasma in the processing chamber that ionizes tantalum sputtered from the target to an ionization percentage of at least 70 percent. Coupling an RF substrate bias power to an electrode in the wafer table is preferably also provided.

BRIEF DESCRIPTION OF THE DRAWINGS

A more complete appreciation of various embodiments of the invention and many of the attendant advantages thereof will become readily apparent with reference to the following detailed description, particularly when considered in conjunction with the accompanying drawings, in which:

FIG. 4 illustrates a tabular listing of exemplary process conditions and process results in accordance with embodiments of the invention;

DETAILED DESCRIPTION OF SEVERAL EMBODIMENTS

Figure 1:
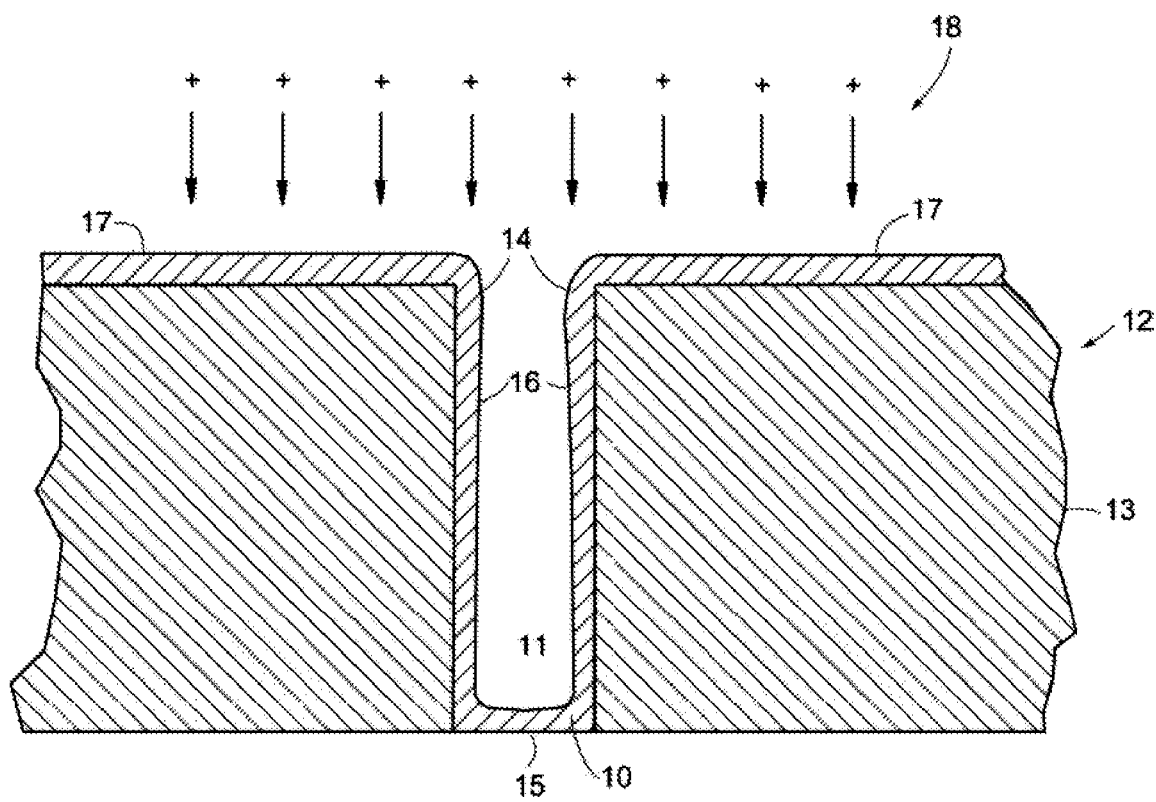
FIG. 1 illustrates a simplified view of a wafer cross-section in accordance with an embodiment of the invention.

A process is described in U.S. patent application Ser. No. 10/138,049, published as U.S. Patent Application Publication No. 20030034244, now U.S. Pat. No. 6,755,945, by Yasar et al., which is assigned to the assignee of the present application, which provides ionized PVD with sequential deposition and etching. While with this type of sequencing the overhang or overburden are much improved over prior processes, some will still form during the deposition sequence and may not be entirely removed in the etch sequence.

Yasar et al. describe a technique to deposit and etch multiple times within a single vacuum chamber. Overhangs are not fundamentally controlled within the deposition step of this process. Higher bias powers are typically used in the deposition step to deposit as much bottom coverage as possible before etching back the bottom to redistribute material to the sidewalls and reduce the bottom coverage, which can add to line resistance. Reduction of overhang is achieved in the subsequent etch steps.

The invention provides a method of operating an ionized physical vapor deposition (iPVD) system to deposit barrier layer material into nano features on a patterned substrate on a wafer table within a processing chamber in the iPVD system. The method may be used, for example, to deposit a barrier layer using a Low Net Deposition (LND) iPVD process, wherein process parameters are adjusted to establish an ultra-low deposition rate in a field area of the patterned substrate. The method may also be used, for example, to repair a barrier.

The field area refers to the upper surface of the substrate being processed and is the surface into which the high aspect ratio vias and trenches extend. An ultra-low deposition rate as referred to herein as a deposition rate of less than about 15 nanometers per minute in the field area.

An iPVD processing system can be used for the barrier deposition processes. These processes can be typically performed in the vacuum processing chamber of an iPVD apparatus in which the substrate to be coated is held on a support. A high-density plasma is maintained in the chamber in a processing gas, which can be, for example, an inert gas into which metal or other coating material vapor has been introduced, usually by sputtering. The high-density plasma is usually ionized by coupling RF energy into the process gas, often by an inductive coupling from outside of the chamber. The RF energy ionizes both the process gas and a fraction of the coating material, which may be to a low plasma potential of only a few volts, but may be higher. The processing gas and the ionized coating material can then be directed onto the substrate by control of the bias on the substrate, to coat and not etch the substrate. For the LND processes of the present invention, an iPVD process is run, but with the deposition rates reduced as explained in the examples below. The parameters of the iPVD process are controlled to produce the LND result on the plasma-facing surface of the substrate, or field area of the substrate. When so controlled, the iPVD process produces the desired result of deposition of a barrier layer or a seed layer, without producing overhangs around the feature openings.

Exemplary embodiments of the method of the invention are described below, which disclose a deposition technique for use with an iPVD system to metallize high aspect ratio vias and trenches by depositing ionized metal with a flux to the field area surface of the substrate that produces a flux to the sidewall of the feature. This technique does not rely on an etch sequence to control the conformality of the metal. The deposition process is such that the overhang or overburden is eliminated or minimized, reducing the reliance on or need for the etch step as an overhang control. In various embodiments, the process involves depositing a thin layer of a barrier metal such as Ta or TaN. For example, the barrier deposition process can be followed by a seed layer process and/or a dry-filling process in which a metal such as copper is used.

This invention is distinctly different from prior art which teaches high DC powers with high RF bias powers for increased conformality or the case where several deposition and etch steps are performed within or in different vacuum chambers. This barrier deposition process is characterized by very low deposition rates. For example, the DC power can be reduced to reduce the deposition rate to less than 10 nm/min. Additionally, a range of RF substrate biases can be applied to the wafer during the barrier deposition process.

FIG. 1 illustrates a simplified view of a wafer cross-section in accordance with an embodiment of the invention. In the illustrated embodiment, a via structure 11 is shown having a barrier film 10 deposited on the sidewalls 16 of the via structure, a barrier film 10 deposited on the bottom 15 of the via structure, and a barrier metal film 17 deposited on the top surface of the substrate. A modified iPVD process is used to deposit the metal film 10 into via structure 11 formed in a dielectric interlayer 13 of a semiconductor wafer 12. As metal ions 18 are deposited onto the wafer 12, the metal deposition has a propensity to become thicker at the via entrance causing an overhang structure 14. The method of the invention can prevent or reduce the overhang structure. Similarly, the deposition of the barrier metal at the bottom 15 of via 11 can become thicker than at the sidewalls 16. The method of the invention provides a substantially conformal deposition of barrier material on the sidewalls and the bottom of the via.

The barrier material can include compounds comprising $TaN(x)$, where x can vary from 0 to 1.5. The Tantalum Nitrogen ratio and the barrier thickness can be controlled during an IPVD process to obtain the best performance with respect to etch resistance, copper diffusion, conformality, and resistivity.

In various embodiments, one or more barrier layers can be deposited into features having critical dimensions less than 50 nm. In addition, the via structure 11 can include substantially straight and/or tapered sidewalls. Alternatively, one or more barrier layers can be deposited into trenches and/or dual damascene features.

Figure 2A:
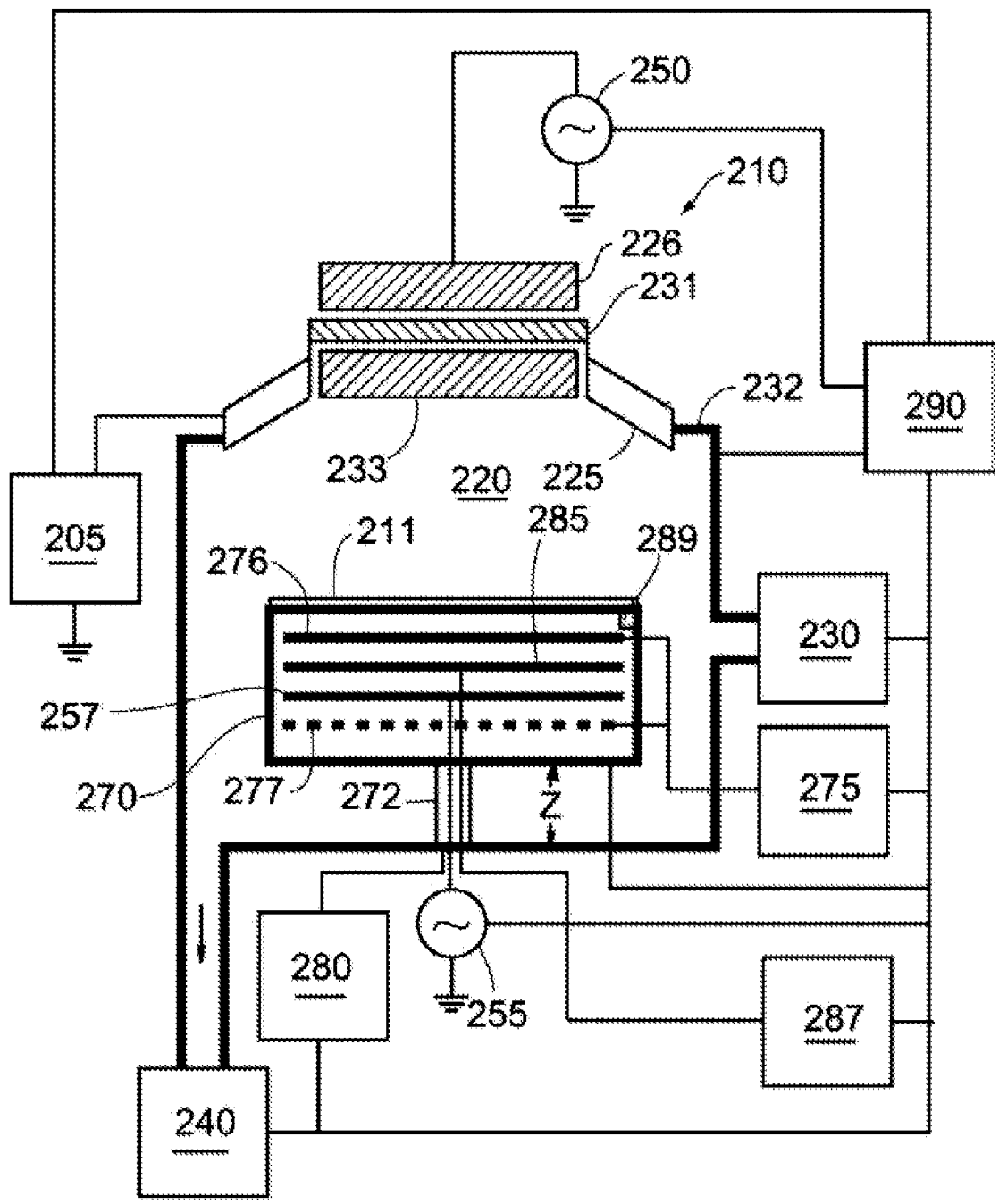
FIG. 2A illustrates an exemplary block diagram of a processing system according to an embodiment of the invention.

FIG. 2A illustrates an exemplary block diagram of a processing system according to an embodiment of the invention. In the illustrated embodiment, an iPVD system 200A is shown.

The IPVD system 200A can comprise an iPVD processing module 210, a DC source 205 coupled to a target 225 that is coupled to the processing chamber 220, a process gas supply system 230 that can be coupled to processing chamber 220, a pressure control system 240 that can be coupled to the processing chamber 220, a RF source 250 that can be coupled to the processing chamber 220, an RF bias generator 255 that can be coupled to an electrode 257 in the substrate holder 270, a backside gas supply system 280 that can be coupled to the substrate holder 270, and an ESC control unit 287 coupled to the ESC 285.

The IPVD system 200A comprises a controller 290 coupled to the processing chamber 220, coupled to the DC source 205, coupled to the gas supply system 230, coupled to the pressure control system 240, coupled to the RF source 250, coupled to the RF bias generator 255, coupled to the substrate holder 270, coupled to the thermal control system 275, coupled to the backside gas supply system 280, and coupled to the ESC control unit 287.

The IPVD processing module further comprises an antenna 226, a window 231 coupled to the antenna, a louvered deposition baffle 233 coupled to the window, a target 225 coupled to the processing chamber 220. RF power can be supplied to the antenna 226 from the RF generator 250, and can be used to create an inductively coupled plasma in the chamber 220.

The antenna 226 can be electrically connected using a RF matching network (not shown) to, and selectively energized or powered by, the RF generator 250. The RF generator 250 can provide a time-varying RF current at a frequency between about 100 kHz and about 100 MHz that is supplied to the antenna 226 at a power ranging between about 100 watts and about 10000 watts. For example, an operating frequency of approximately 13.56 MHz can be used. Alternately, other frequencies can be used. When energized by the RF generator 250, the antenna 226 radiates isotropic RF electromagnetic fields. A metallic outer enclosure or cage (not shown) can be used to surround the antenna to confine the radiated RF electromagnetic fields therein to ensure the safety of nearby persons and to prevent electromagnetic interference with surrounding electronics.

Examples of iPVD systems are described in U.S. Pat. Nos. 6,287,435; 6,080,287; 6,197,165 and 6,132,564, and these patents are hereby expressly incorporated herein by reference.

In one embodiment, a controllable backside pressure can be established that allows the apparatus controller to set the relative influence of the backside pressure on the respective process steps differently, depending on the process parameters. This may include variable backside pressures or flexible duty cycles.

The antenna 226 can be positioned outside of the process chamber 220 behind a dielectric window 231 in the chamber wall 232. A louvered deposition baffle 233, preferably formed of a slotted metallic material, is located inside of the chamber 220 closely spaced from the window 231 to shield the window 231 from deposition. The controller 290 can be used to determine the amount of ICP power to provide and when to have it applied to the antenna. For example, ICP power from the RF generator 250 to the antenna 226 can be switched between different power levels during the different steps in a barrier deposition process.

The IPVD system 200A can also comprise a substrate holder 270 that can include an electrostatic chuck 285 and can be coupled to the processing chamber using a Z-motion drive 272. The Z-motion drive 272 can be used to adjust the substrate-to-source distance to provide the best deposition uniformity. The controller 290 can be used to determine the gap size required during the barrier deposition process and provide the control data to the Z-motion drive 272 when it is required. During a barrier deposition process, the substrate-to-source distance can typically be 150 to 300 mm.

The substrate holder 270 can accommodate a 200 mm substrate, a 300 mm substrate, or a larger substrate. For example, substrate 211 can be transferred into and out of processing chamber 220 through an opening (not shown) that is controlled by a gate valve assembly (not shown). In addition, substrate 211 can be transferred on and off the substrate holder 270 using a robotic substrate transfer system (not shown). In addition, substrate 211 can be received by substrate lift pins (not shown) housed within substrate holder 270 and mechanically translated by devices housed therein. Once the substrate 211 is received from the transfer system, it can be lowered to an upper surface of the substrate holder 270.

During processing, a substrate 211 can be held in place on top of the substrate holder 270 using an electrostatic chuck 285. Alternately, other clamping means may be used.

In addition, the substrate temperature can be controlled when the substrate is on the substrate holder 270. The substrate holder can include a heater assembly 276 and a cooling assembly 277 that can be coupled to the temperature control system 275. The heater assembly 276 and the cooling assembly 277 can be used along with one or more backside gasses to establish the correct substrate temperature. The temperature of the substrate 211 can be controlled to obtain the best via metallization. The controller 290 can be used to determine and control the substrate temperature. For example, the cooling assembly 277 may include fluid passages (not shown) in the substrate holder 270 and the appropriate temperature controls.

The thermal conductivity between the substrate holder 270 and the substrate 211 can be controlled by providing backside gas between the substrate 211 and the substrate holder 270. Process parameters can be controlled during the barrier deposition process to ensure that the metal deposited in the via structures is uniform. For example, heat generated in the substrate 211 during plasma processing can be extracted efficiently by the substrate holder 270 to keep the temperature of the substrate 211 at a substantially constant temperature, or the heat can be used to increase the substrate temperature.

Gas channels (not shown) can be used to direct a backside (heat transfer) gas, such as helium or argon, between the top of the substrate holder 270 and the facing surface of the substrate 211. For example, a two-zone system may be used to establish different and independent backside pressure values for a center portion and an edge portion thereby providing a different thermal conductivity between the substrate holder and different portions of the substrate.

The backside gas can be used to control the transfer of heat energy between the substrate holder 270 and substrate 211 by providing an efficient heat transfer medium. The electrostatic chuck 285 can also be used to control the transfer of heat between the substrate 211 and substrate holder 270. For example, the electrostatic force can be made approximately uniform to cause a significant portion of the facing surface of the substrate 211 to physically contact the top surface of the substrate holder 270 and to contact the top surface of the substrate holder 270 with a substantially uniform force. The electrostatic force can also be controlled to limit the leakage of heat transfer gas from beneath the substrate 211 when the backside gas pressure changes, thereby maintaining a controlled backside gas pressure and providing the correct thermal conductivity between the substrate 211 and the substrate holder 270.

One or more temperature sensors 289 can be positioned at one or more locations on or within the substrate holder 270 and can be coupled to the controller 290 that converts signals from the temperature sensors 289 to provide an indication of the temperature of different portions of substrate holder 270. The temperature of the substrate holder 270 can be used to determine the temperature of the substrate 211 and the controller 290 can provide feedback information to the temperature control system 275 and the backside gas supply system 280 for regulating the temperature of substrate 211.

For example, the backside gas can be supplied at a pressure in a range from approximately zero Torr to approximately ten Torr, and the backside gas can apply a force to the substrate 211 due to the pressure differential between the backside gas pressure and the pressure within the vacuum processing chamber 220 which can vary during processing between about 5 mTorr and about 500 mTorr. The force applied by the backside gas acts to displace the substrate 211 from the substrate holder 270, and to counteract this force, a clamping voltage can be applied to the electrostatic chuck 285 to establish an attractive electrostatic force of a magnitude sufficient to secure the substrate 211 to the substrate holder 270.

RF bias power can be supplied to an electrode 257 in the substrate holder 270 using the RF bias generator 255, and can be used to provide a substrate bias. The controller 290 can be used to determine the amount of RF bias power to provide and when to have it applied to the substrate holder 270. For example, RF bias power can be turned on to a level appropriate during barrier deposition processes to control the bias on the substrate 211 to improve and affect the process.

The operating frequency for the RF bias generator 255 can range from 1 MHz to 100 MHz. The RF bias generator 255 can be used to selectively apply a bias potential that accelerates positively charged plasma components toward the substrate. The bias potential provided by the RF bias generator 255 substantially determines the kinetic energies of positive ions attracted to the substrate from the plasma. The RF bias generator 255 typically operates at a frequency of about 13.56 MHz and at a power between about 100 watts and about 1000 watts. Alternately, the RF bias generator 255 may be omitted from the processing system and the substrate holder may be either grounded or electrically floating. Alternately, other frequencies can be used, such as 2 MHz or 27 MHz.

Process gas can be provided to the processing chamber 220 by the gas supply system 230. The process gas can comprise a nitrogen-containing gas, or an inert gas, or a combination thereof. The inert gas may be argon, which is often used, but may also be any other inert gas or may be a non-inert gas that is compatible with the process.

Chamber pressure can be controlled using the pressure control system 240. In addition, process gas can be supplied into the vacuum processing chamber 220 by the gas supply system 230. The chamber pressure can be maintained at a low pressure by the pressure control system 240. The controller 290 can be used to control the pressure control system 240, and/or the gas supply system 230 and to control the chamber pressure accordingly.

DC power can be supplied from a power source 205 to the target 225. The controller 290 can be used to determine the amount of DC power to provide and when to have it applied to the target.

The controller 290 can be configured to provide control data to the system components and receive process and/or status data from the system components. In addition, the controller 290 may be coupled to another control system (not shown), and can exchange information with the other control system. For example, the controller 290 can comprise a microprocessor, a memory (e.g., volatile or non-volatile memory), and a digital I/O port capable of generating control voltages sufficient to communicate and activate inputs to the iPVD system 200A as well as monitor outputs from the IPVD system 200A. Moreover, the controller 290 can exchange information with the system components, and a program stored in the memory can be utilized to control the aforementioned components of an iPVD system 200A according to a process recipe. In addition, the controller 290 can be configured to analyze the process and/or status data, to compare the process and/or status data with desired process and/or status data, and to use the comparison to change a process and/or control a system component. In addition, the controller can be configured to analyze the process and/or status data, to compare the process and/or status data with historical process and/or status data, and to use the comparison to predict, prevent, and/or declare a fault.

Figure 2B:
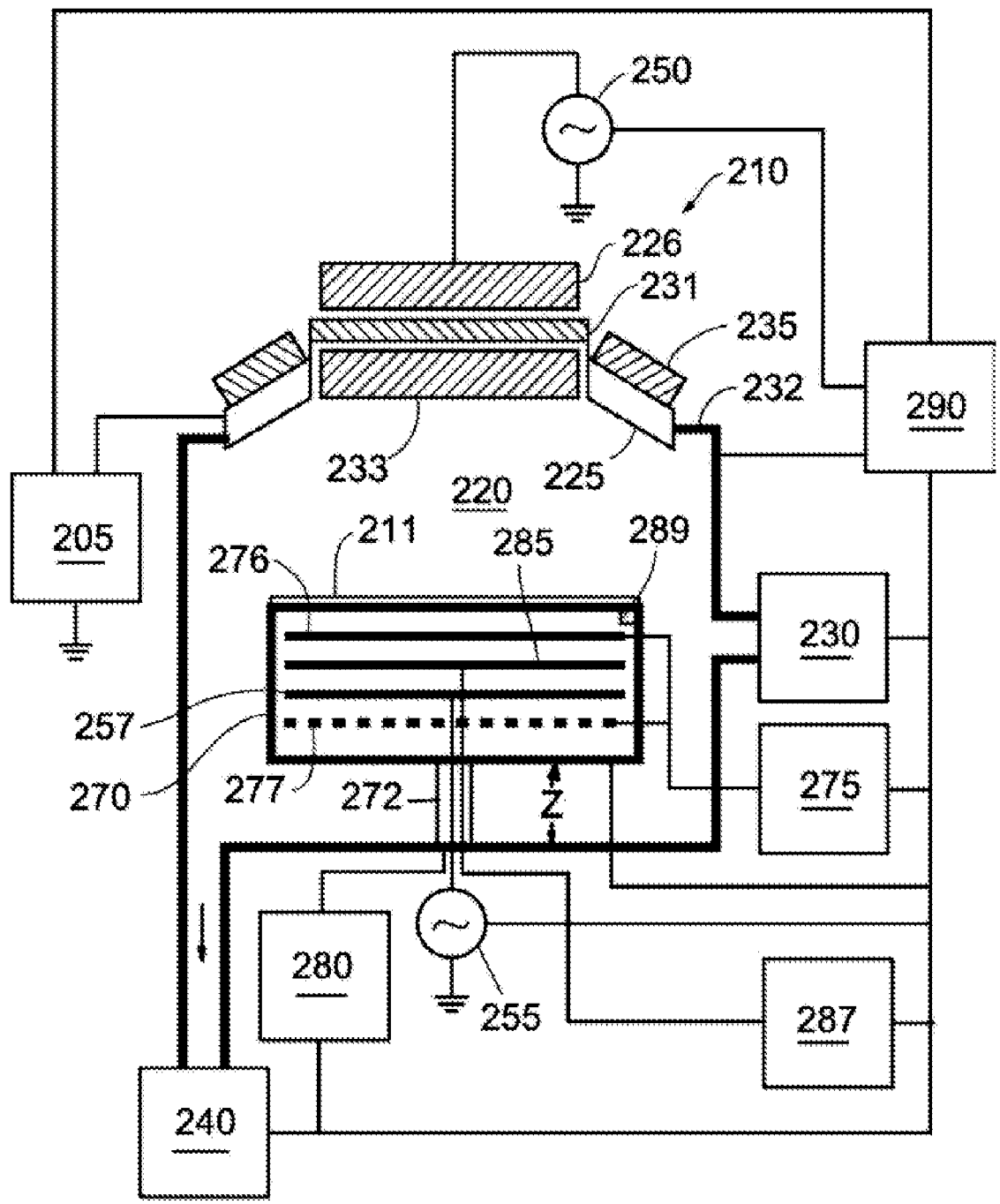
FIG. 2B illustrates an exemplary block diagram of a processing system according to an alternate embodiment of the invention.

FIG. 2B illustrates an exemplary block diagram of a processing system according to an alternate embodiment of the invention. In the illustrated embodiment, an IPVD system 200B is shown that can include the IPVD system shown in FIG. 2A along with a magnet assembly 235 coupled to the processing chamber 200. The magnet assembly 235 may be used to shape the plasma within the processing chamber 200. Examples of apparatus having reduced and controllable magnetic fields are described in U.S. patent application Ser. No. 10/795,093, published as U.S. Pat. App. 20040188239, and this patent application is incorporated herein by reference.

As shown in FIG. 2B, a magnet assembly 235 can be located behind the target 225 and can be used to produce and/or change a static magnetic field shape in a process volume within the chamber. In one embodiment, a barrier deposition process can be performed using a magnet assembly 235 having a weak magnetic field strength. Field lines from the magnets can extend into the process volume. In alternate embodiments, these or other field lines present in the chamber may be caused to change to enhance the barrier deposition process. For example, magnetic fields may be changed by controlling the magnet configuration, by physically moving and/or rotating a magnet. In addition, an electromagnet or electromagnet component may be used to change a magnetic field. In addition, a local static magnetic field may be used to optimize the performance of the target.

Some magnet pack configurations for IPVD may typically produce static magnetic field strength at the target surface of over 150 Gauss or several hundred Gauss, to provide confinement of the plasma and a desired erosion profile and high target utilization. Reducing the static magnetic field strength at target surface to about 5-10 Gauss eliminates this confinement effect.

In various embodiments, one or more process parameters can be measured and compared with desired process parameters to control the operation of one or more components of the iPVD system. The measured performance can be used to alter one or more process parameters, such as a DC-on time, a shaping plasma process time, a DC-off time, a DC power, a backside pressure, substrate holder temperature, substrate temperature, etching rate, and/or deposition rate.

The controller 290 can be used to determine the amount of heat energy that the heater assembly 276 provides and when to have it provided to the substrate 211. The amount of heat energy can be changed between different levels during a barrier deposition process. In addition, the cooling element 277 can be used to control the temperature of the substrate holder 270 and the substrate 211. For example, the thermal mass of the substrate holder 270 can be controlled to optimize its thermal response time. Furthermore, the thermal conductance between the substrate holder 270 and the substrate 211 can be controlled by providing backside gas between the substrate 211 and the substrate holder 270. The controller 290 can monitor and control the substrate temperature, the temperature of the substrate holder 270, the temperature control system 275, the backside gas system 280, and other process parameters during a barrier deposition process to ensure that the metal deposition within the features is substantially uniform. In addition, the performance of the electrostatic chuck 285 may be controlled to compensate for changes in the backside pressure.

Figure 3:
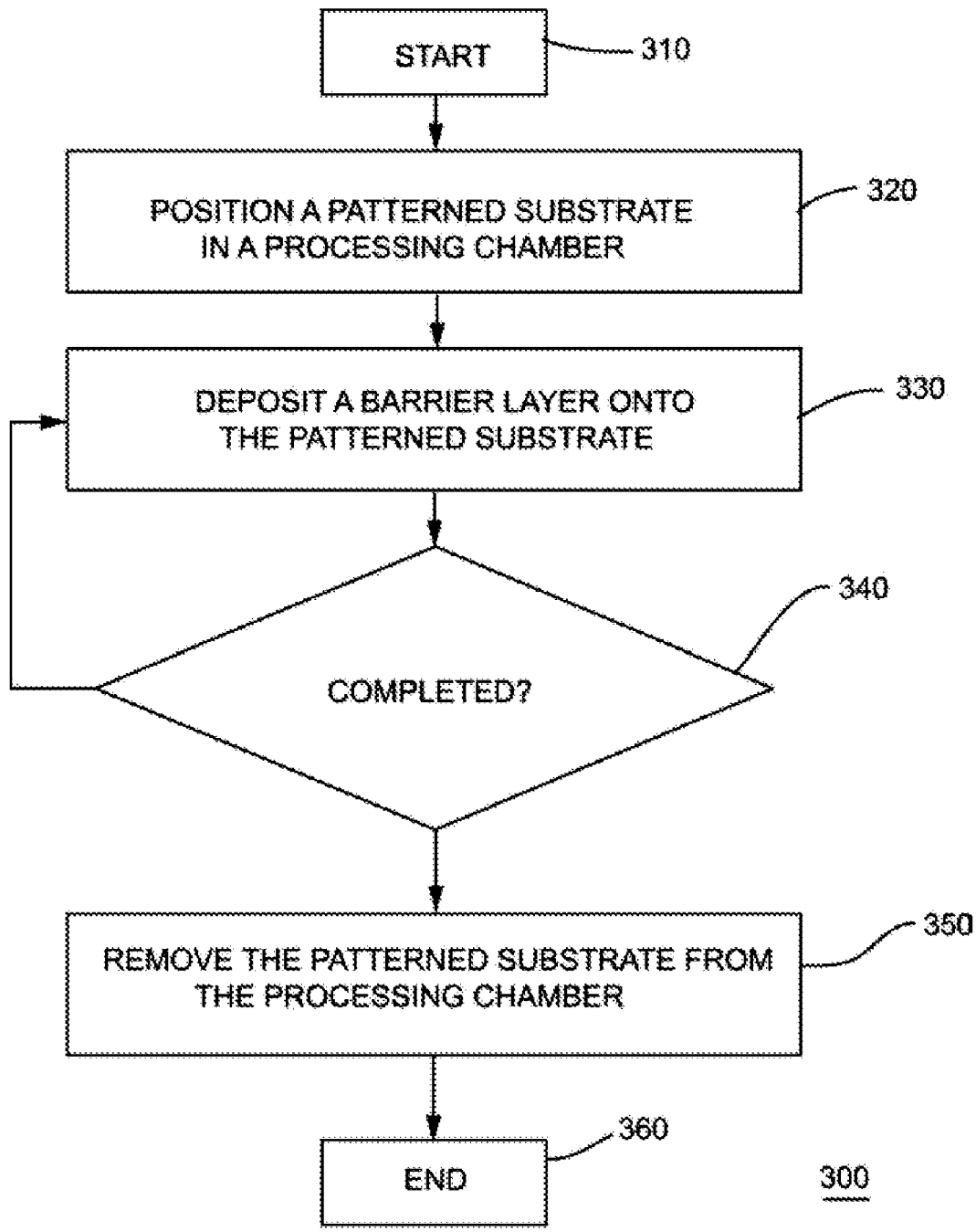
FIG. 3 illustrates a simplified flow diagram of a method of operating a deposition system to perform a barrier deposition process in accordance with an embodiment of the invention.

FIG. 3 illustrates a simplified flow diagram of a method of operating a deposition system to perform a process in accordance with an embodiment of the invention. In the illustrated embodiment, a more etch resistant TaN barrier layer id deposited using a LND process. In alternate embodiments, other procedures can be performed that may include one or more NND processes, one or more LND processes, and various combinations of LND processes and NND processes. Procedure 300 starts in 310.

In 320, a patterned substrate/wafer can be positioned on a wafer table in a processing chamber as described herein. Alternately, a non-patterned substrate/wafer may be used. For example, the processing chamber can be an iPVD chamber. In one embodiment, the wafer table can be vertically translated to establish the required gap (240 mm) between the target and the substrate. Alternately, the gap can be established at a different time or the gap may be dynamically changed during the process. The gap size can range from approximately 150 mm to 300 mm. For example, the gap can range from approximately 200 mm to 270 mm.

The chamber pressure can be lower to value between approximately 50 mtorr and approximately 150 mtorr. For example, barrier deposition processes have been performed at 65 mTorr and 90 mTorr.

In 330, a barrier deposition process can be performed. In one embodiment, a Ta and or TaN barrier can be deposited, and a Low Net Deposition (LND) process can be performed to deposit a conformal barrier layer that has improved etch resistance and better diffusion barrier properties. For example, annealing experiments/tests were performed to verify the improved performance.

In one embodiment, ICP power can be provided to an antenna coupled to the processing chamber during the barrier deposition process. In an alternate embodiment, a different configuration may be used as a plasma source, and an antenna may not be required. The ICP source can be an RF generator, and the ICP source can operate in a frequency range from approximately 1.0 MHz to approximately 100 MHz. For example, the ICP source can be operated at approximately 13.56 MHz. The ICP power can range from approximately 2000 w to approximately 10000 w. For example, the ICP power can range from approximately 4700 w to approximately 5700 w.

The processing system can also comprise a gas supply system that is coupled to the processing chamber, and the gas supply system can be used to flow process gas into the processing chamber during one or more parts of the barrier deposition process. The process gas can comprise an inert gas, or a nitrogen-containing gas, or a combination thereof. The nitrogen-containing gas can comprise $N_2$, NO, $N_2O$, and $NH_3$, and the inert gas can comprise argon, helium, krypton, radon, xenon, or a combination thereof. In some embodiments, the processing gas can be pulsed.

In addition, when Argon gas is used during a barrier deposition process, the flow rates for the Argon gas can range from 200 sccm to 1000 sccm. For example, an Argon gas flow rate of approximately 500 sccm was used during some barrier deposition processes. was flowed at The processing system can also comprise a metallic target, and the metallic target can be used to provide a source of metal ions. A DC power source can be coupled to the metallic target. In various embodiments, the DC power can range from approximately 100 watts to approximately 3000 watts during a barrier deposition process. For example, an upper limit for the DC power level can be established to prevent target poisoning.

The IPVD system can be used to perform a number of deposition processes and the IPVD system can be configured for a number of different targets that can include tantalum (Ta), titanium, (Ti), ruthenium (Ru), iridium (Ir), aluminum (Al), silver (Ag), lead (Pt), or copper (Cu), or a combination thereof. In a preferred embodiment, a Ta target is used. For example, metal ions can diffuse towards the wafer surface based on the bias power, and can be affected by a self-bias voltage within a plasma sheath, which is the potential difference between the potential of the plasma and the potential at the wafer surface.

Using the apparatus and method of the present invention, a TaN barrier can be deposited with higher N concentration (higher N/Ta ratio). For example, an IPVD system can be used to perform a new LND process. The process is stable and metal mode can still be maintained with a higher N concentration in the film.

The new LND process includes a lower deposition rate and a higher ionization process that allows a more etch resistant TaN barrier to be deposited. An ultra-thin barrier can be deposited and the ultra-thin barrier can still act as barrier to Cu diffusion as well as "etch stop" layer for subsequent deposition/etch processes, such as Ta (for wetting) layer or Cu for seed layer.

Furthermore, the present invention provides a stable metal mode with a high N/Ta ratio, and does not allow the target to become poisoned (nitrated).

In addition, certain embodiments can be configured to have either a reduced strength static magnetic field in vicinity of the target surface or with no static cathode magnetic field. A weak magnet configuration may be used to maintain the static magnetic field shape and orientation so that the field within the target area and the nearby plasma generates an optimal erosion profile for high target utilization. Such low or reduced field strength can be maintained constant in the barrier deposition processes, or may be changed to a different level during the barrier deposition process. For example, a controllable magnetic field may be used to provide a weak or zero static magnetic field, for example less than 10 Gauss, in the process volume. Furthermore, a controllable magnetic field may be used to reduce and/or reshape the magnetic field to adjust the field uniformity across the target surface.

In one embodiment, a process and an apparatus are provided wherein the simultaneous control of the target power and the RF substrate bias power is used a provide a process that causes a Low Net Deposition (LND) in the field area of the substrate. For example, a process can be provided that involves depositing a thin layer of metallization, for example, tantalum (Ta), tantalum nitride (TaN) or copper (Cu) into features of the substrate.

For example, a Ta(LND) process can be performed using the following parameters: a DC power equal to approximately 1600 watts, an ICP power equal to approximately 5250 watts, a RF substrate (table) bias equal to approximately 200 watts, a gap equal to approximately 252 mm, a process time equal to approximately 25 seconds, a field deposition rate that is less than or equal to approximately 10 nm/minute, a chamber pressure equal to approximately 65 mTorr, a nitrogen ($N_2$) flow rate equal to approximately 15 sccm and an Argon flow rate equal to approximately 498 sccm. In addition, a number of deposition cycles can be perform, and the Ta(NND) process can be repeated a number of times (1-10) without adverse affects. When multiple cycles are performed the process parameters can remain constant, or alternately one or process parameters can change during different cycles.

Furthermore, during the LND processing time, a chamber pressure, a chamber temperature, a substrate temperature, a process gas chemistry, a process gas flow rate, a gap size, an ICP power, substrate position, a target power, and a RF substrate bias power can be adjusted to establish and/or maintain the required LND deposition rate. As the LND process is performed material can be deposited into features of the patterned substrate while producing substantially no overhanging material at openings of the features and a low net deposition in the field area of the substrate.

The TaN barrier deposition rate can comprise a deposition rate that can range from approximately −10 nm/min to approximately +10 nm/min. For example, the field deposition rate can range from approximately +6 nm/min to approximately +10 nm/min. The TaN barrier deposition rate can comprise a sidewall deposition rate that is the rate of deposition of material on one or more sidewalls of one or more features of the patterned substrate. The sidewall deposition rate can range from approximately −1 nm/min to approximately +10 nm/min. For example, sidewall deposition rate can vary from approximately 20% to approximately 100% of the field deposition rate. The TaN barrier process can comprise a bottom surface deposition rate that is the rate of deposition of material on one or more bottom surfaces of one or more features of the patterned substrate. During various portions of the TaN barrier process, the bottom surface deposition rate can range from approximately −10 nm/min to approximately +10 nm/min. For example, the bottom surface deposition rate can range from approximately −5 nm/min to approximately +5 nm/min.

In the TaN barrier process, a deposition time period may be used to add material on the field area on the top surface of the wafer and a shaping (DC-off) time may be used to remove an amount of material on the field area on the top surface of the wafer, and thus there is a low net deposition at the end of the process cycle on the field area on the top surface of the wafer. In addition, during the NND process, the deposition component may add material on the bottom and/or side surfaces of features on the wafer and the etching (sputtering) component may remove a lesser amount of material on the bottom and/or side surfaces of features on the wafer, and thus there is a net deposition at the end of the process cycle on the bottom and/or side surfaces of features on the wafer. The deposition/etch cycle can be repeated as many times as needed to achieve the desired result. By adjusting the DC level and the RF substrate bias levels, the overhang growth is eliminated or minimized. The overhang may be etched back and redistributed at least partially to the sidewalls. For example, the sputtering component can remove some of the excess material from the via bottom and from the overhangs. When the metal layer is copper, the etch process increases the continuity of the Cu on the bottom and top portions of the feature sidewalls by redeposition of Cu sputtered from the via bottom and from the overhang at the via entrance. If the metal being etched is a barrier layer, the decrease in the thickness at the via bottom reduces the overall contact resistance of the via and improves device performance. To deposit a barrier layer of a metal nitride such as $TaN_x$, nitrogen gas, in addition to Argon gas, is used during sputter deposition.

In 340, a query is performed to determine when the process has been completed. When the process has been completed, procedure 300 continues to 350, and when the process has not been completed, procedure 300 branches back to 330, and procedure 300 continues as shown in FIG. 3. For example, one or more of the LND deposition processes may be performed one or more times.

For example, after a certain desired amount of deposition, the DC power to the target and the RF substrate bias can be simultaneously turned off to substantially stop the deposition process. Those skilled in this art will realize that the deposition process can be substantially reduced and/or stopped by reducing the DC power level to a very low level without completely turning it off. When multiple cycles are performed the process parameters can remain constant, or alternatively one or process parameters can change during different cycles.

In 350, the processed substrate can be removed from the processing chamber.

Procedure 300 can end in 360.

For example during process development, a TaN(LND1) process was performed using the following parameters: a DC power equal to approximately 2200 watts, an ICP power equal to approximately 5250 watts, a RF substrate (table) bias equal to approximately 200 watts, a gap equal to approximately 220 mm, a process time equal to approximately 24 seconds, a deposition rate equal to approximately 16 nm/minute, a chamber pressure equal to approximately 65 mTorr, an Argon flow rate equal to approximately 480 sccm, and a Nitrogen flow rate equal to approximately 24 sccm. In addition, a number of deposition cycles can be perform, and the TaN(LND1) process can be repeated a number of times (1-10) without adverse affects.

In another example during process development, a TaN (LND1) process was performed using the following parameters: a DC power equal to approximately 1500 watts, an ICP power equal to approximately 5250 watts, a RF substrate (table) bias equal to approximately 200 watts, a gap equal to approximately 220 mm, a process time equal to approximately 5.3 seconds, a deposition rate equal to approximately 30 nm/minute, a chamber pressure equal to approximately 5 mTorr, an Argon flow rate equal to approximately 105 sccm and a Nitrogen flow rate equal to approximately 23 sccm.

In a different example during process development, a TaN (LND2) process was performed using the following parameters: a DC power equal to approximately 1500 watts, an ICP power equal to approximately 5250 watts, a RF substrate (table) bias equal to approximately 400 watts, a gap equal to approximately 220 mm, a process time equal to approximately 5.4 seconds, a deposition rate equal to approximately 30 nm/minute, a chamber pressure equal to approximately 5 mTorr, an Argon flow rate equal to approximately 105 sccm and a Nitrogen flow rate equal to approximately 23 sccm.

In some cases the wafer can be removed from the processing chamber and measured in another chamber. For example, an optical metrology tool can be used. In addition, Scanning Electron Microscope (SEM) data and/or TEM data can be used.

Measurement data can be obtained during a process and used to determine when to stop the process. Measurement data can include chamber pressure data, chamber temperature data, substrate temperature data, process gas chemistry data, process gas flow rate data, target material data, ICP power data, substrate position data, target power data, RF substrate bias power data, processing time data, process recipe data, or a combination thereof.

A processing time may be used to determine when to stop a process. Alternately, thickness data can be used to determine when to stop a process.

The additional process can comprise an LND process, an NND process, a conventional deposition process, an etching process, a deposition/etch process, a cleaning process, a measurement process, a storing process, an electroplating process, or a combination thereof. The additional processes can be performed in the same processing chamber or other processing chambers. For example, one or more processing chambers can be coupled to each other by a transfer system.

Timing can be controlled so that the target power is provided and/or changed at the correct setpoints in the process recipe. For example, the target power can be controlled to eliminate or control/minimize an etching component.

The apparatus and methods of the invention can be used to produce an ultra-thin substantially amorphous barrier having excellent etch resistance properties, excellent Copper diffusion properties, without damaging the underlying layers or poisoning the target. The apparatus and methods of the invention provide a wide stable process window in which a LND process is performed using a "non-poison" metal mode).

FIG. 4 illustrates a tabular listing of exemplary process conditions and process results in accordance with embodiments of the invention. As shown in the table, the barrier deposition processes (processing space) can be examined using density data, and Rutherford Back Scattering (RBS) density data and/or x-ray fluorescence (XRF) density data can be examined. Five different processes are shown. Two exemplary processes were performed at a first pressure (65 mT) and three exemplary processes were performed at a second pressure (90 mT). The inventor discovered that the higher pressure process provided denser films with higher Nitrogen concentrations. The inventor also discovered that a low deposition rate (<10 nm/min) produced the barrier films with the best properties. In alternate embodiments, other process parameters and/or combinations of process parameters may be used to examine the barrier deposition process space. RBS and/or XRF can be used to measure the stoichiometry of barrier films, where the stoichiometry is measure the ratio of one element to another element in the barrier film. Alternatively, other measurement devices known to those skilled in the art can be used. The inventor believes that the higher pressure and higher ionized process resulted in the densest film. The trend is that the better the ionization the denser the film.

Figure 5:
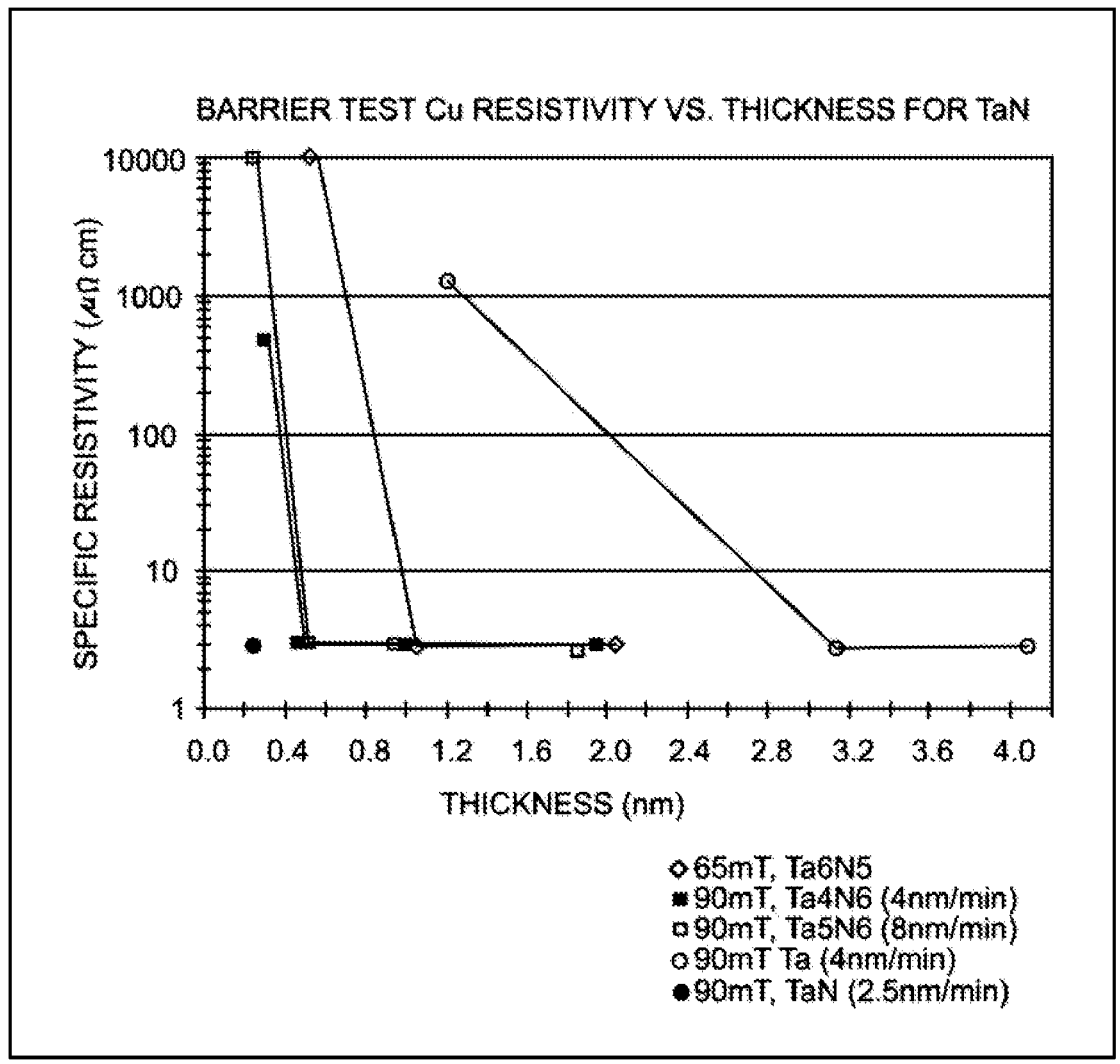
FIG. 5 illustrates an exemplary graph of another set of process results in accordance with embodiments of the invention.

FIG. 5 illustrates an exemplary graph of another set of process results in accordance with embodiments of the invention. As shown in the illustrated embodiment, the processing space can be examined using a barrier thickness (nm) for the x-axis and using a specific resistivity value for the y-axis. Five different processes are shown. One barrier layer process was performed at a first pressure (65 mT) and a $Ta_6N_5$ film was produced. A second barrier layer process was performed at a second pressure (90 mT) and a $Ta_4N_6$ film was produced using a deposition rate of (4 nm/min). A third barrier layer process was performed at the second pressure (90 mT) and a $Ta_5N_6$ film was produced using a deposition rate of 8 nm/min). A fourth barrier layer process was performed at the second pressure (90 mT) and a Ta film was produced using a deposition rate of (4 nm/min). A fifth barrier layer process was performed at the second pressure (90 mT) and a TaN film was produced using a deposition rate of (2.5 nm/min). The inventor believes that the lowest deposition rate process had the best Cu barrier film properties, and that the higher pressure as well as higher Nitrogen concentration tended to increase the barrier property of the film. Film with the best barrier property to Cu was confirmed by Secondary Ion Mass Spectrometry (SIMS) to have the best oxidation resistance (barrier to oxygen diffusion). SIMS data from an ultra low-k (ULK) substrate was used to measure the oxygen incorporation in Cu film.

Figure 6:
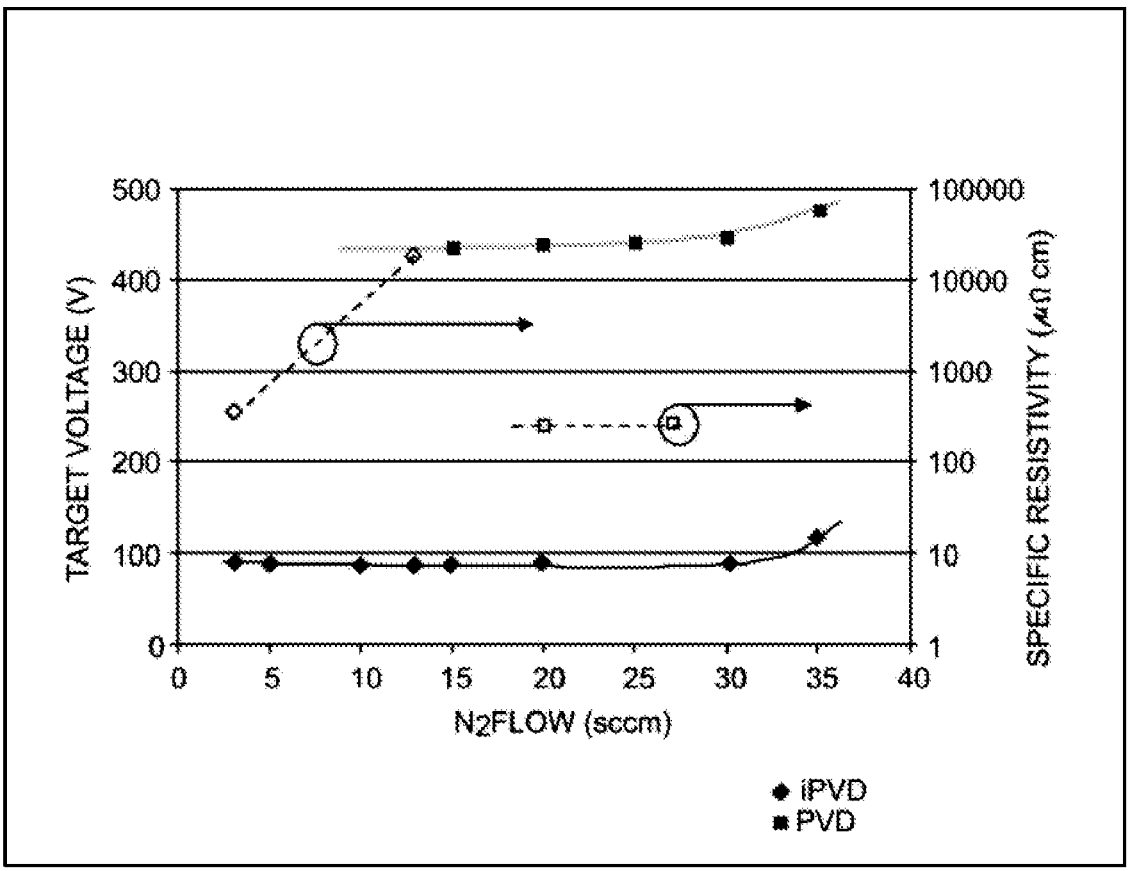
FIG. 6 illustrates another exemplary graph of another set of process results in accordance with embodiments of the invention.

FIG. 6 illustrates another exemplary graph of another set of process results in accordance with embodiments of the invention. As shown in the illustrated embodiment, the processing space can be examined using a Nitrogen flow rate for the x-axis and using a target voltage for one y-axis and a specific resistivity for another y-axis. Results for an IPVD process and a PVD process are shown.

Regarding the data shown in FIG. 6, the inventor has observed that the target voltage for the 90 mT, low DR iPVD is stable up to 30 sccm of $N_2$ flow indicating a solid non-poison mode (no target nitriding). In addition, the specific resistivity of a 10 nm TaN(x) film can be increased significantly under these conditions allowing for a very large process window to "design" and tailor the desired film properties over many integration schemes. The PVD like deposition (much lower ionization) shows a narrower process window before the poison mode (target nitriding) is obtained. Furthermore, the specific resistivity of the film is relatively independent of $N_2$ flow significantly reducing the ability to tailor the film properties for a variety of integration schemes. The inventor believes that this data is further evidence that lower deposition rate and higher the ionization processes have a more stable and larger process window. The data shows that the 90 mT 2.5 nm/min deposition rate TaN had the highest specific resistivity, even though it did not have the highest nitrogen incorporation. The inventor believes there is a clear trend that lowering the deposition rate results in higher resistivity for the film, and that this correlates well with the best barrier property to Cu and oxygen, The inventor believes that the amount of metal ionization, the amount of nitrogen incorporated into the film, and deposition rate are keys to designing TaN IPVD/PVD films with desirable barrier film properties.

Figure 7:
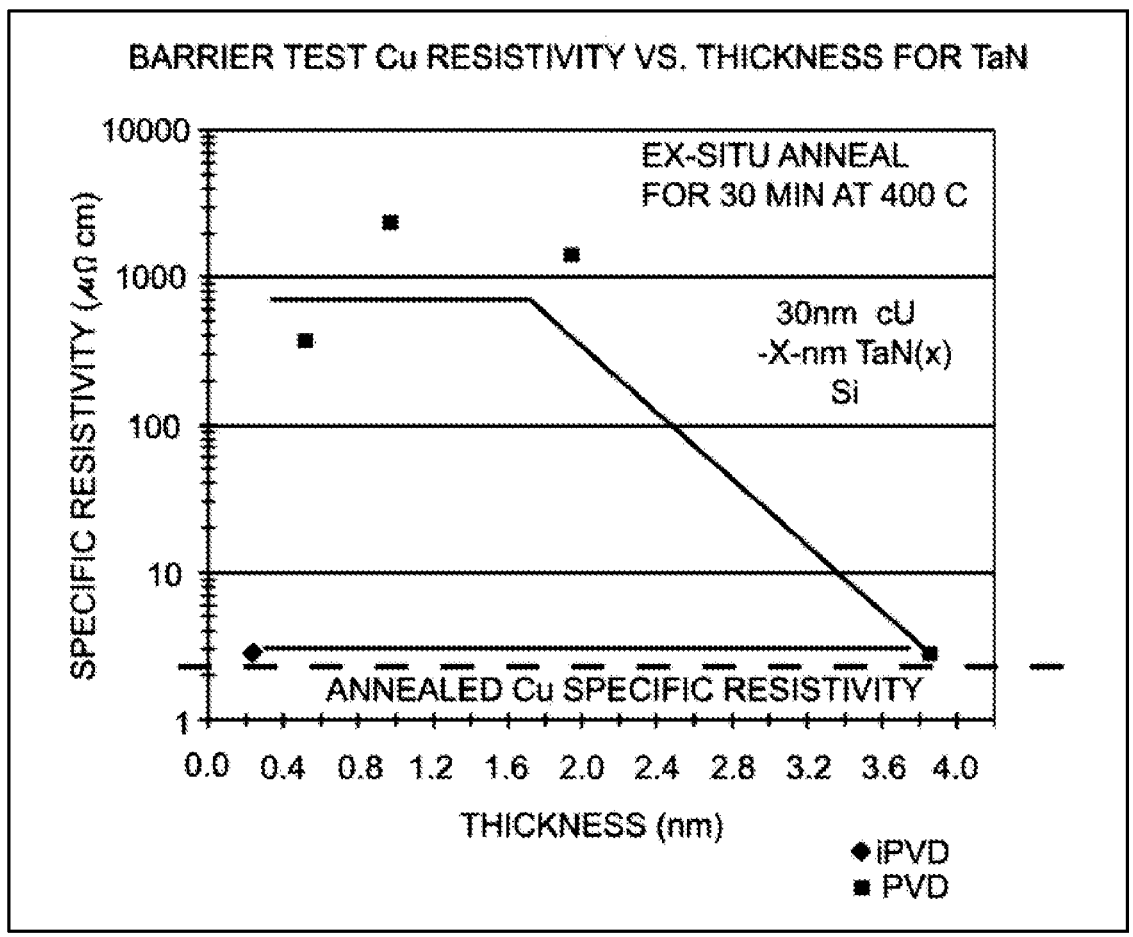
FIG. 7 illustrates an exemplary graph of an additional set of process results in accordance with embodiments of the invention.

FIG. 7 illustrates an exemplary graph of an additional set of process results in accordance with embodiments of the invention. As shown in the illustrated embodiment, the processing space can be examined using a thickness value for the x-axis and using a specific resistivity value for the y-axis. Results for an IPVD process and a PVD process are shown.

Regarding the data shown in FIG. 7, the inventor has observed that the TaN(x) deposited at 90 mT with a low deposition rate has the best barrier properties. In addition, the highest resistivity TaN(x) (>18K micro-ohm-cm) passed the Cu diffusion test with a thickness <0.4 nm, and the PVD like TaN(x) failed to provide any barrier property below 2 nm.

Figure 8:
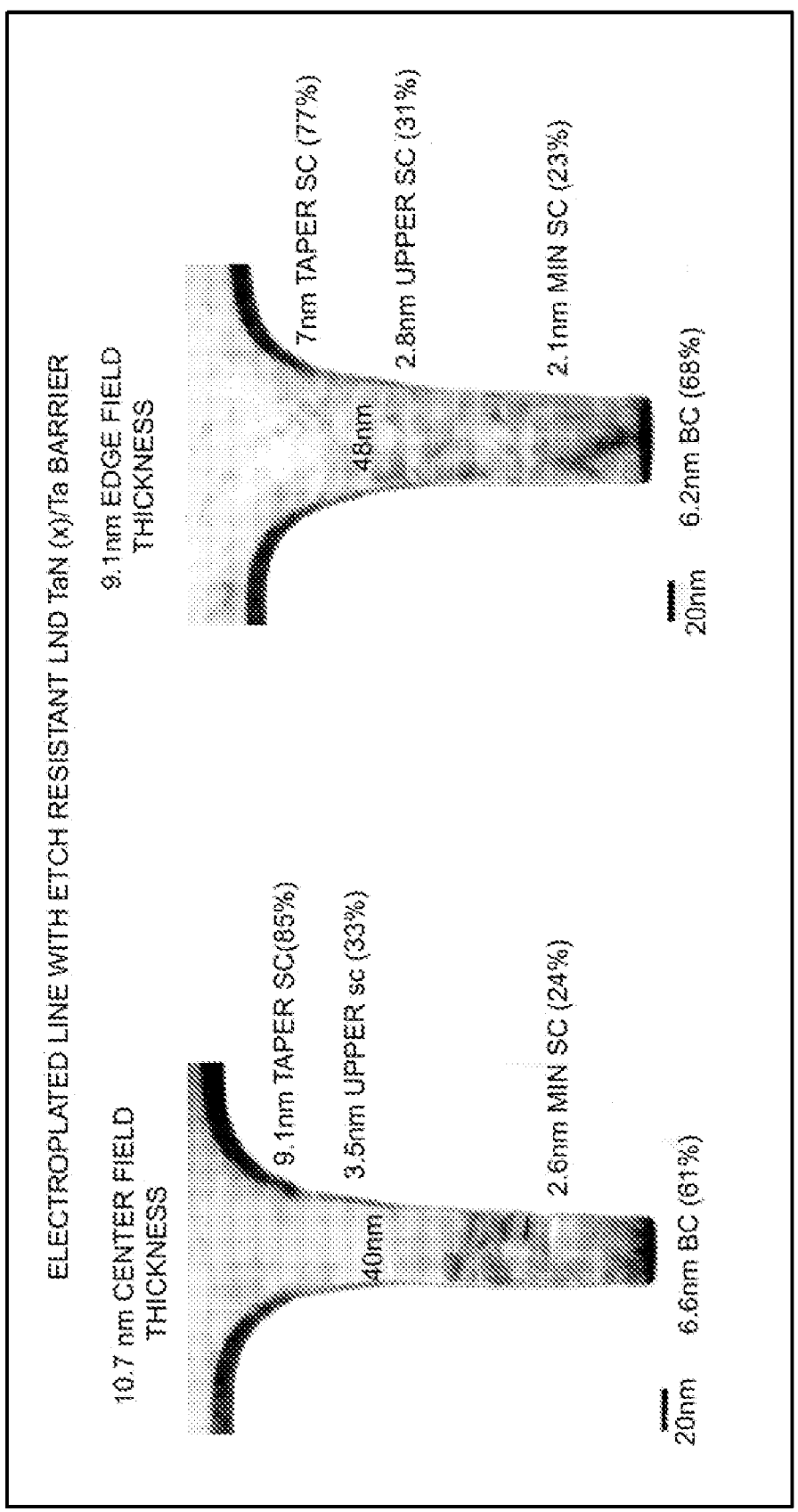
FIG. 8 illustrates exemplary process results in accordance with embodiments of the invention.

FIG. 8 illustrates exemplary process results in accordance with embodiments of the invention. A Transmission Electron Microscopy (TEM) image is shown for a TaN/Ta barrier that was deposited using 90 mT LND TaN/Ta barrier processes. The inventor believes that an amorphous film was produced because structure is not visible in the nitride.

The inventor believes that the bottom coverage will vary from approximately 30% to approximately 90%; that the sidewall coverage will vary from approximately 10% to approximately 90%

The apparatus and methods of the invention provide a wide process window. For example, the processing time window is expected to vary from approximately 10 seconds to approximately 300 seconds, and multiple cycles can be performed to obtain a graded or uniform layer. The chamber pressure can vary from approximately 50 mtorr to approximately 150 mtorr, the ICP power can vary from approximately 2000 watts to approximately 10000 watts; the target power can vary from approximately 100 watts DC to approximately 3000 watts DC; the substrate bias power can vary from approximately 0 watts to approximately 300 watts; the flow rate for an inert gas can vary from approximately 0 sccm to approximately 1000 sccm; the flow rate for a nitrogen-containing gas can vary from approximately 0 sccm to approximately 100 sccm; the gap size between the substrate and the target can vary from approximately 150 mm to approximately 300 mm; the substrate temperature can vary from approximately −30° C. to approximately 250° C.; the field deposition rate can vary from approximately 5 nm/min to approximately 50 nm/min; the bottom coverage (BC) deposition rate can be a percentage of the field deposition rate and the BC percentage can vary from approximately 5% to approximately 50%; the sidewall coverage (SC) deposition rate can be a percentage of the field deposition rate and the SC percentage can vary from approximately 5% to approximately 50%.

In addition, the apparatus and methods of the invention provide a large process window to vary nitrogen incorporation in a TaN(x) barrier film. The thin film specific resistivity can vary from Ta only (160 micro-ohm-cm) to an insulator like >18K micro-ohm-cm while maintaining the target in non-poison or metal mode. An excellent copper (Cu) barrier can be provided with very thin iPVD film (<4 nm), and an excellent moisture and/or oxidation barrier can be provided with a very thin iPVD film (<4 nm). Furthermore, the deposited iPVD films have amorphous and/or nano-crystalline film properties.

The invention provides a method of depositing an ultra-thin TaN barrier layer having a high Nitrogen concentration to produce a high N/Ta ratio layer for providing a barrier to copper (Cu) diffusion, and during the deposition process, the DC target operates in non-poison or metal mode to provide target voltage stability, deposition rate stability, and improved process stability.

The invention provides a method for controlling the film stoichiometry of Ta-containing films on the sidewalls of ultra-small high aspect ratio features. The invention provides a large process window for depositing amorphous films, and uses low target power while operating in a non-poisoning mode. The invention provides methods for producing barrier layers having excellent oxidation/copper diffusion barrier properties by using high pressure (>50 mT) and low DC power (<3000 watts) to produce barrier layers have high N film stoichiometry and high specific resistivity.

The invention provides a method of depositing an ultra-thin TaN barrier layer and during the deposition process the Nitrogen concentration is varied to produce a barrier layer having a range of N/Ta ratios for providing a harder film with improved copper (Cu) diffusion barrier properties and improved etch resistance properties.

In addition, the invention provides a method of depositing an ultra-thin TaN barrier layer having a high Nitrogen concentration to produce a high N/Ta ratio layer for providing a barrier to oxidation and/or moisture diffusion. For example, this can be especially useful for ultra low-k (ULK) dielectrics or high moisture containing dielectrics.

Furthermore, the invention provides a method of depositing an ultra-thin iPVD TaN barrier layers with amorphous or nano-crystalline film properties to provide better barrier properties than can be obtained using ALD or CVD processes.

In the metallization of high aspect ratio via holes and trenches on semiconductor wafers, it is required that the barrier layer and the seed layer have good sidewall and bottom coverage. The barrier layer needs to be as thin as possible without sacrificing its barrier properties. The barrier layer must be thin because its electrical resistance, which adds to the electrical resistance of the via structure, must be minimized. It needs to be conformal and continuous to prevent diffusion of seed layer material into the dielectric layer and into other layers to prevent reliability problems. This requires that the barrier layer thickness must be well controlled and minimized especially at the bottom of the via. A thick barrier layer at the bottom of the via may add substantial undesirable electrical resistance to the resistance of interconnect metallization.

In the LND barrier deposition process, metal can be sputtered off the target at a low rate. This results in only a minor dilution of the process gas ion plasma. The metal ionizes and is deposited on the wafer with a rate that can be less than 10 nm/min. A low bias is applied to the wafer to attract the ions to the bottom of the feature. Because of the low field deposition rate and the low bias, the metal deposits with little or no overhang developing. The sidewall coverage is enhanced, and the result is a highly conformal metal deposition, ideal for a barrier metal.

When a reactive one, such as TaN, the $N_2$ or another reactive gas can be added during the LND barrier deposition process. During the barrier deposition process, the nitrogen flow is controlled so that the LND/IPVD process is performed in a target non-poisoned mode or metal mode, which is more desirable. Other prior art systems may operate in the poisoned mode by allowing higher reactive gas flow rates, and this is not desirable. Nitrogen flow can be further varied to grade the metal nitride composition from a nitrogen rich to nitrogen deficient metal nitride or from nitrogen deficient to nitrogen rich metal nitride with this invention. This feature is highly desirable because it allows the user to tailor the stoichiometry of the metal nitride. Whether better barrier properties (higher $N_2$ content) are desired, or better wetting properties (lower $N_2$ content) are necessary, this invention can accommodate the user's needs. For example, the sidewall stoichiometry of a metal nitride can be controlled throughout the deposition process by varying nitrogen or reactive gas flow. In addition, the nitridization of a metal film sidewall can be controlled by controlling an $Ar/N_2$ ratio during the barrier deposition process.

Within the LND processing window, little or no etching of the interlayer dielectric or pre-metalized surface occurs during this process because of the application of an appropriate wafer bias.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A method of operating an Ionized Physical Vapor Deposition (IPVD) system to deposit a barrier layer, the method comprising:

positioning a patterned substrate on a wafer table within a processing chamber, the processing chamber including a tantalum target opposite the wafer table;

flowing a process gas comprising an inert gas and a nitrogen containing gas into the processing chamber;

inductively coupling an energy from an inductively coupled plasma (ICP) source to the inert gas within the processing chamber to form a high density plasma;

sputtering tantalum from the tantalum target and into the high density plasma;

adjusting a chamber pressure within the processing chamber and a bias power applied to the wafer table to achieve at least 70% ionization of the tantalum within the high density plasma;

depositing an ultra-thin TaN barrier layer having a high nitrogen concentration by a deposition process onto the patterned substrate, wherein the ultra-thin TaN barrier layer has a resistivity of at least 1000 micro-Ohm-cm, resists copper diffusion, and provides a high etch resistant etch-stop layer for subsequent processes; and removing the patterned substrate from the processing chamber.

2. The method as claimed in claim 1, wherein:
the ICP source includes an antenna that is coupled to the processing chamber and that operates at an ICP power and an ICP frequency to create the high density plasma in the processing chamber; and the IPVD system includes an RF bias generator coupled to an electrode in the wafer table such that the deposition step further comprises:

establishing the chamber pressure of between approximately 50 mTorr and approximately 150 mTorr;

flowing the process gas into the processing chamber at a first flow rate of between approximately 10 sccm and approximately 1000 sccm;

energizing the antenna during a processing time;

energizing the tantalum target during the processing time with a target power of between approximately 100 watts and approximately 3000 watts;

coupling, to the electrode in the wafer table during the processing time, an RF substrate bias power;

flowing nitrogen-containing gas into the processing chamber at a second flow rate; and exposing the patterned substrate to the high-density plasma during the processing time.

3. The method as claimed in claim 2, wherein the processing time is from approximately 10 seconds to approximately 240 seconds.

4. The method as claimed in claim 2, wherein the ICP frequency is from approximately 1 MHz to approximately 100 MHz.

5. The method as claimed in claim 2, wherein the ICP power is greater than approximately 2000 watts and less than approximately 10000 watts.

6. The method as claimed in claim 2, wherein the RF substrate bias power is equal to or greater than approximately zero watts and less than approximately 400 watts.

7. The method as claimed in claim 2, wherein the target power is greater than approximately 300 watts and less than approximately 2000 watts.

8. The method as claimed in claim 2, wherein a deposition rate is established during the processing time, the deposition rate comprising a field deposition rate, a sidewall deposition rate, or a bottom surface deposition rate, or a combination thereof.

9. The method as claimed in claim 8, wherein the field deposition rate is in a range of from approximately −10 nm/min to approximately +20 nm/min.

10. The method as claimed in claim 9, wherein the field deposition rate is in a range of from approximately −5 nm/min to approximately +5 nm/min.

11. The method as claimed in claim 8, wherein the sidewall deposition rate is less than approximately +10 nm/min.

12. The method as claimed in claim 11, wherein the sidewall deposition rate is less than approximately +5 nm/min.

13. The method as claimed in claim 8, wherein the bottom surface deposition rate is in a range of from approximately −2 nm/mm to approximately +10 nm/min.

14. The method as claimed in claim 13, wherein the bottom surface deposition rate is in a range of from approximately −1 nm/min to approximately +5 nm/min.

15. The method as claimed in claim 2, wherein the IPVD system further comprises a magnet assembly coupled to the processing chamber for producing a magnetic field within the processing chamber.

16. The method as claimed in claim 2, wherein the deposition process is repeated Ni times, wherein Ni is an integer between one and five.

17. The method as claimed in claim 2, wherein the nitrogen-containing gas comprises $N_2$, NO, $N_2O$, or $NH_3$, or a combination thereof.

18. The method as claimed in claim 2, wherein the second flow rate of the nitrogen-containing gas is established at a value of approximately zero sccm during a portion of the processing time.

19. The method as claimed in claim 2, wherein the second flow rate of the nitrogen-containing gas is pulsed between a first value and a second value during a portion of the processing time.

20. The method as claimed in claim 1, wherein the depositing step is used to repair a barrier layer.

21. The method as claimed in claim 1, wherein the ultra-thin barrier layer is less than four nm thick on a sidewall of a via of the patterned substrate.

22. The method as claimed in claim 1, wherein the depositing step is used to produce a net deposition rate of less than about 15 nm/min in a field area of the patterned substrate.

23. An Ionized Physical Vapor Deposition (IPVD) method of depositing a barrier layer comprising:

positioning a patterned substrate on a wafer table within a processing chamber of an IPVD apparatus having a tantalum target therein;

establishing within the processing chamber a chamber pressure of at least 50 mTorr;

flowing a process gas comprising an inert gas and a nitrogen-containing gas into the processing chamber;

inductively coupling energy from an RF antenna at a power and a frequency to the inert gas in the processing chamber that will create a high density inductively coupled plasma (ICP) in the processing chamber;

sputtering tantalum from the tantalum target and into the high density ICP and ionizing at least 70% of the sputtered tantalum in the high density lop;

depositing an ultra-thin TaN barrier layer at a rate of not more than approximately 20 nm/min by sufficiently adjusting the flow of the nitrogen containing gas into the processing chamber to produce the ultra-thin TaN barrier layer having a resistivity of at least 1000 micro-ohm-cm; and removing the patterned substrate from the processing chamber.

24. The method of claim 23 wherein:
the depositing of the ultra-thin TaN barrier layer includes flowing the nitrogen-containing gas at a rate and energizing the tantalum target at a power that avoids nitriding the tantalum target.

25. The method of claim 24 wherein:
the depositing of the ultra-thin TaN barrier layer is at a rate of between 2 nm/min and 10 nm/min.

26. The method of claim 23 wherein:
the depositing of the ultra-thin TaN barrier layer is at a rate of between 2 nm/min and 10 nm/min.

27. The method of claim 23 further comprising:
coupling an RF substrate bias power to an electrode in the wafer.

* * * * *

UNITED STATES PATENT AND TRADEMARK OFFICE
CERTIFICATE OF CORRECTION

| | |
|---|---|
| PATENT NO. | : 7,700,474 B2 |
| APPLICATION NO. | : 11/279039 |
| DATED | : April 20, 2010 |
| INVENTOR(S) | : Frank M. Cerio, Jr. |

It is certified that error appears in the above-identified patent and that said Letters Patent is hereby corrected as shown below:

Column 1

Line 33, "have" should be --has--.

Column 3

Line 34, after "herein", insert --is--.

Column 6

Line 9, "gasses" should be --gases--.

Column 8

Line 65, "id" should be --is--.

Column 9

Line 16, "mtorr", both instances, should be --mTorr--.
Line 52, delete "was flowed at".

Column 10

Line 54, "perform" should be --performed--.
Line 57, after "one or", insert --more--.

Column 12

Line 2, after "one or", insert --more--.
Line 17, "perform" should be --performed--.

Signed and Sealed this
Eighth Day of March, 2011

David J. Kappos
*Director of the United States Patent and Trademark Office*

Column 13

Line 7, delete ")".

Column 14

Line 12, delete the word "the".

Line 50, "mtorr" should be --mTorr--.

Line 51, "mtorr" should be --mTorr--.

Column 15

Line 44, "layers" should be --layer--.

Column 16

Line 6, delete "When" and insert --With--.

Line 6, delete "one" and insert --process--.

Line 6, after "such as", insert --for--.

Column 17

Line 53, "nm/mm" should be --nm/min--.

Column 18

Line 38, "lop" should be --ICP--.

Line 60, after "wafer", insert --table--.